PROXIMITY SENSITIVE ON-OFF OSCILLATOR SWITCH CIRCUIT

Filed Sept. 14, 1967 2 Sheets-Sheet 1

INVENTORS:
John J. Magyar
Richard J. Zollinger
By Smyth, Roston & Pavitt
ATTORNEYS

PROXIMITY SENSITIVE ON-OFF OSCILLATOR SWITCH CIRCUIT

Filed Sept. 14, 1967 2 Sheets-Sheet 2

INVENTORS:
John J. Magyar
Richard J. Zollinger
By [signature]
ATTORNEYS

United States Patent Office 3,469,204
Patented Sept. 23, 1969

3,469,204

PROXIMITY SENSITIVE ON-OFF OSCILLATOR SWITCH CIRCUIT

John J. Magyar, Arcadia, and Richard J. Zollinger, Claremont, Calif., assignors, by mesne assignments, to Whittaker Corporation, Los Angeles, Calif.

Filed Sept. 14, 1967, Ser. No. 667,795
Int. Cl. G08b *21/00*
U.S. Cl. 331—65 8 Claims

ABSTRACT OF THE DISCLOSURE

A proximity switch using a feedback oscillator in which the loss resistance of an LC circuit forms part of the feedback circuit and determines the condition for production and inhibition of the oscillator in dependence upon an object in the vicinity of the inductor of the LC circuit.

The present invention relates to a proximity switch and more particularly to an electrical apparatus for sensing presence or absence of an object in its proximity. The phenomena of eddy current losses of an excited inductor when magnetically coupled to an object in its proximity has been used in the past for purposes of detecting absence or presence of that object. In particular, it is known to place a resonance circuit in proximity of a metallic object (or the metallic object is brought into proximity of the inductor in the resonant circuit). If the metallic object couples inductively to the inductance of the resonance circuit the parameters thereof change. In particular, there occurs a change in the resonance frequency, or, for an exciter signal of given frequency, the complex impedance of the resonance circuit changes. These changes have been used for providing an indication of the absence or presence of such a metallic object in the vicinity of the resonance circuit. For example, the resonance circuit may constitute a component in an oscillator circuit which includes a second resonance circuit. Depending on the complex, frequency depending impedance of the first resonance circuit the other oscillator may or may not oscillate. Such a circuit may encounter difficulties because the parameters of the oscillator and of the resonance circuit can change due to other causes, such as temperature, if the environmental temperature does, in fact, change.

The proximity switch, in accordance with the present invention arose from the task of finding a construction for such a switch so that it can be used for sensing the position of retractable landing gear in an airplane, such as the undercarriage and/or the nose wheel, A positive, faultless representation is required to indicate whether either of those elements has obtained their proper position before landing. These positions should thus be sensed by a proximity switch, utilizing general physical characteristics of those elements rather than specific actuations on them cooperating with stationary devices for contact making and breaking or the like. Moreover, the operational environment of such a switch is subjected to changes in temperature over a very large range.

The invention is related to a circuit for use as a proximity detector in which the complex impedance and resonance frequency or frequencies of an oscillator are not of immediate significance. The invention makes use of the fact that a resonance circuit when resonating exhibits across its terminals a resistivity which is equivalent of the losses of, by and in the resonance circuit.

If the inductor of the resonance circuit is in the vicinity of an object, the variable magnetic field around the induction induces current in that object serving as more or less short-circuited secondary "winding" of a transformer of which the inductor in the resonance circuit is the primary winding. The resistance of this secondary transformer circuit is reflected as loss resistance into the resonance circuit and becomes effective as loss resistance across and between the terminals thereof.

The loss resistance as effective between the terminals of the resonance circuit will be relatively high for high losses into an adjacent metallic object when the resonance circuit is a series resonance circuit. The loss resistance as effective between the terminals of a parallel resonance circuit will be relatively low in case of high losses into an adjacent object. When the sensing resonance circuit is removed from the metallic object (or vice versa) the loss resistance as effective between the terminals of a series resonance circuit will be small and essentially dictated by the ohmic losses in the coil of the inductor when the resonance circuit resonates at resonance frequency, whatever the value of that frequency may happen to be. The loss resistance, as effective in a parallel resonance circuit, will be relatively high when the metallic object is not in proximity of the inductor consonant with a very high complex impedance of such a circuit when resonating.

The resonance circuit is now incorporated in a feedback amplifier circuit establishing an oscillator which is provided with a fixed and preferably adjustable feedback gain, for sustaining oscillations in the resonance circuit, whereby the loss resistance as effective between the terminals of the resonance circuit forms a part of the resistive network in the feedback circuit. The loss resistance of the resonance frequency in relation to other (ohmic) resistances in the feedback circuit determines whether the feedback oscillator can or cannot oscillate, i.e., whether or not the feedback amplifier circuit can sustain oscillations in the resonance circuit. In particular, the resistance network is adjusted so that the loss resistance as effective between the terminals of the resonance circuit, in case of high losses into an adjacent object in conjunction with the remaining resistances in the feedback circuit are unable to sustain oscillations, while in case of absence of the object in the vicinity of the inductor of the resonance circuit, the effective loss resistance across the terminals of the resonance circuit is such that in conjunction with the remaining resistances of the feedback network, oscillations can be sustained. The conditions permitting or inhibiting sustenance of oscillations are essentially independent from the non-ohmic complex impedance of the resonance circuit, and particularly independent from the resonance frequency. The circuit does not require any driver source for providing signals at a particular frequency, the resonance circuit is thus not employed as an impedance in a circuit driven from an external source of particular frequency. If the resonance circuit is a series resonance circuit, then the feedback oscillator will sustain oscillations if the loss resistance effective between the terminals of the resonance circuit is relatively low due to low losses. For high losses this effective loss resistance increases, and oscillations cannot be sustained. If the resonance circuit is a parallel resonance circuit, the feedback oscillator will sustain oscillations if the loss resistance effective between the terminals of the resonance circuit is relatively high due to low losses. For high losses the effective loss resistance decreases, and oscillations cannot be sustained.

It was said above that the resistances in the feedback network can or should be made adjustable. The resulting adjustment establishes, in effect, a critical value for the effective loss resistance across the terminals of the resonance circuit which defines the border between sustaining and inhibition of oscillations. Hence, the adjustment predetermines a distance for a specific object. If that object is closer to the inductor of the resonance circuit, it is regarded as being in the proximity; when farther than the particular distance, the object is regarded as absent. If the object has known dimensions and known properties, the distance for determining the changeover from the oscillating state to the nonoscillating state is accurately determinable. If this distance is a given, operating parameter for the system of which the proximity switch is a part, then the required adjustment in the feedback circuit will to a considerable extent depend on the electrical and magnetic properties, the size, etc., of such an object. The inventive concept can be realized in different embodiments. While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawing in which:

Proceeding now to the detailed description of the drawings, the principles involved in practicing the present invention shall be explained with reference to FIGURE 1.

Figure 1:
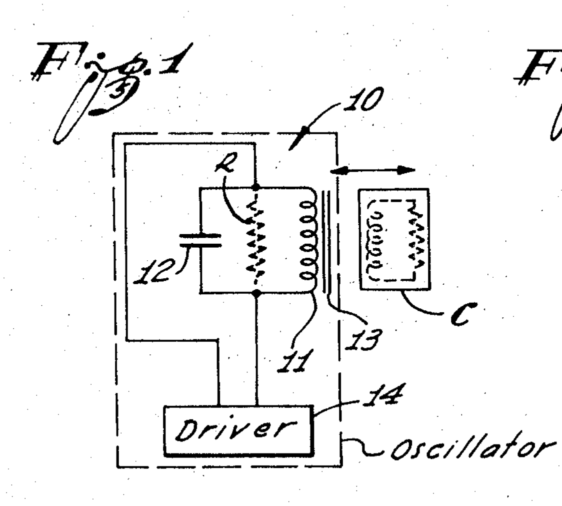
FIGURE 1 illustrates a simple parallel resonance circuit in relation to a metallic object in the vicinity of an inductor of the resonance circuit, the figure is being used to explain the principal phenomena involved in the present invention.

FIGURE 1 illustrates an LC circuit 10 comprised of an inductor coil 11 and a capacitor 12 connected in parallel. Coil 11 may be wound on a core 13. The LC circuit is connected to a D-C feedback controlled driver stage 14 which provides controlled power to LC circuit 10 to replenish the losses therein to some extent, so that oscillations can be sustained in the LC circuit provided the losses are not excessive.

The complex impedance of the LC network can be measured at a given frequency in that the component of the voltage across the LC circuit which is in phase with the current is equivalent to the real part of the impedance. The out-of-phase component is equivalent to the imaginary part. In the particular circuit capacitor 12 has essentially constant capacitance and provides, therefore, constant real and imaginary components for the overall or complex impedance of the LC circuit. The inductor 12–13, however, has an inductance which depends on the proximity of the metallic target. The alternating magnetic field produced by the coil when passed through by an A-C current generates a current in a conductive object such as metallic object C in its vicinity. This will be the equivalent of a secondary on the core 13 with a load resistance.

The induced current in object C has its own magnetic field which is coupled to the field of the inductor and the resulting flux change in core 13 is responsible for an inductance change. This change affects the frequency and the imaginary part of the overall impedance. More important, however, is that the induced current in metallic object C causes a power dissipation in the metal which is the result of the equivalent resistance connected to the supposed secondary coil. The power dissipation is reflected back to the inductor as a change in the resistive component thereof. The relative change in power loss is very much higher than the relative change in inductance.

The power loss occurs only if a metallic object C is rather close to the coil-core structure 11–13. The losses of the LC circuit are relatively small if object C is relatively far away. When the losses are high, driver 14 has to provide more current to LC circuit 10 in order to sustain oscillations therein. If driver 14 fails to provide sufficient current, i.e., if driver 14 fails to offset the losses incurred, LC circuit 10 will cease to oscillate.

In the case of the parallel resonance circuits as illustrated, the loss resistance of object C itself is effective as parallel resistor R in circuit 10. R is variable with distance of the object. If object C is remote from the inductor, the resistivity of resistor R is high, consonant with a high complex impedance when the circuit resonates. Hence, feedback amplifier-driver 14 will be designed to provide for sustenance of oscillations when R is large. As object C approaches, losses increase and the resistivity of resistor R goes down until driver 14 is unable to sustain oscillations. As oscillations cease, the resonant circuit exhibits in the circuit only the relatively small resistivity of coil 13. Any transient in the resonance circuit tending to set up oscillations is quickly attenuated by the low resistivity of reflected resistor R, operating as parallel, short-circuiting power dissipating resistor for the resonance circuit.

For a series resonance circuit oscillations require low series resistivity in the circuit, existing only when the losses are small. Hgh losses reflect into a series resonant circuit as high series and damping resistor. The feedback amplifier drive 14 must then be designed accordingly.

Figure 2:
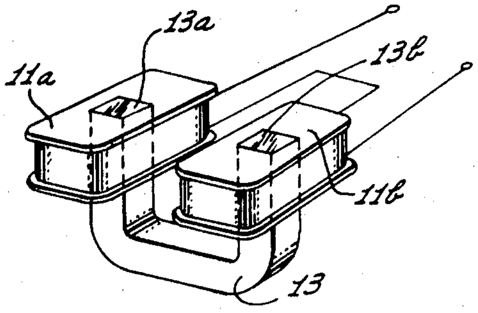
FIGURE 2 illustrates a preferred construction for the inductor in the resonance circuit in accordance with the present invention.

FIGURE 2 illustrates the preferred form for an inductor to be used in a system in accordance with the present invention. The inductor is composed of two coils **11*a* and 11*b* mounted respectively on the legs of a U-shaped core 13. The core can be made of ferrite or of a laminated, high permeability material. The magnetic flux path emanates essentially perpendicular from the two coplanar pole shoe faces 13*a* and 13*b*. This arrangement gives the desired flux pattern outside of the inductor. An object C of variable position along the normal to the plane of the two pole shoe faces 13*a*, 13*b*** produces losses as aforedescribed and to the extent of its proximity to that plane. Proximity is thus measured essentially along that normal. It is important to maximize the Q of the inductor so that the power loss due to winding and core losses are small and considerably smaller than the power loss due to proximity of the metallic target.

Figure 3:
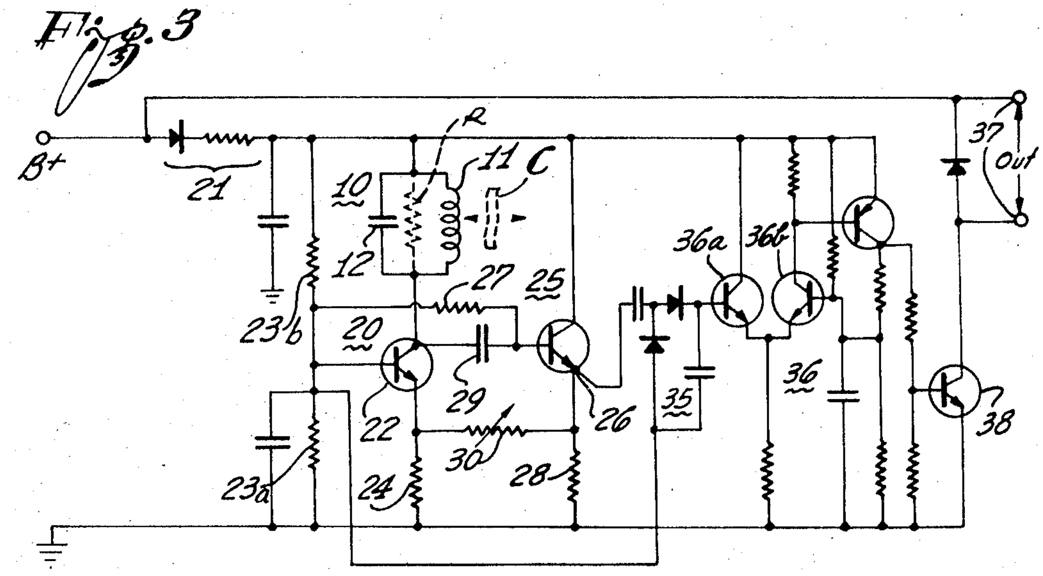
FIGURE 3 illustrates a circuit diagram which is the preferred embodiment of the present invention.

Turning now to a description of FIGURE 3, there is illustrated a circuit in accordance with the preferred embodiment for a proximity switch of the present invention. B+ and ground are the sources of potential for powering the system. The B+ terminal serves also as one of the output terminals of the system. A rectifier and filter circuit 21 keeps oscillations from the power source and from the output circuit. B+ is thus applied through rectifier and filter circuit 21 to the circuit elements to be described.

The circuit includes a parallel LC circuit 10 and thus includes coil 11 and capacitor 12. The inductor may have physical configuration, as shown in FIGURE 2, and thus is actually comprised of two coils on the essentially U-shaped core and connected in series. One terminal of the LC circuit is connected to B+ through circuit 21; the other terminal of the parallel LC circuit connects to a current amplifier 20, and here particularly to the collector electrode of a transistor 22 constituting the primary active element of current amplifier 20. The base electrode of transistor 22 is connected to the tap of a voltage divider arrangement **23*a*–23*b* connected between B+ and ground for supplying bias to the base. The emitter of transistor 22 is grounded through resistor 24, which is larger than resistor 23*a* so that the base is essentially grounded. Amplifier 20 is adjusted to have unity current gain, i.e., the emitter current of transistor 22** is essentially equal to its collector current.

The feedback circuit for current amplifier 20 includes a voltage amplifier 25 of unity voltage gain having a transistor 26, the base of which is coupled to the collector of transistor 22 through a capacitor 29. The base of transistor 26 is galvanically connected through a high ohmic resistor 27 to the junction of voltage divider 23a–23b. The collector of this transistor 26 is directly connected to B+ (through rectifier-filter circuit 21). The emitter of transistor 26 is connected to ground through a resistor 28 which is considerably smaller than resistor 27. The A-C voltage at the emitter of transistor 26 is equal to the voltage at the junction of the collector of transistor 22 and of LC circuit 10, because the latter is coupled to voltage amplifier 25 of unity gain through capacitor 29. A resistor 30 interconnects the two emitter electrodes of transistors 22 and 26 and, therefore, closes the A-C feedback path for the current amplifier 20 to establish the oscillator.

Oscillations in LC circuit 10 can be sustained by the amplifier 20 with feedback circuit if the resistance of adjustable resistor 30 is smaller than the equivalent resistance R of the LC circuit with R including the reflected losses. Since the effective loss resistance R between the terminals of LC circuit 10 will go down with increasing losses into an object in the proximity of coil 11, the collector current of transistor 22 in unity current gain amplifier 20 will tend to increase. The D-C current through adjustable resistor 30, however, is fixed, so that the D-C current in amplifier 20 available for sustaining the oscillations in LC circuit 10 will drop. If the loss resistance drops below the resistance of resistor 30 as adjusted, the oscillator will cease to oscillate.

One can see that the circuit is essentially insensitive to changes in the inductance of the inductor 11 and, therefore, to any shift in frequency of the LC circuit. The imaginary component of the complex impedance influences very little the existence or nonexistence of oscillations. Therefore, the device is essentially independent from changes in the resonance frequency of LC circuit 10 due to, for example, temperature changes.

The proximity of a metallic object in terms of a minimum distance from the inductor 11 can be detected in that the object causes absence or presence of oscillations as they occur, for example, at the emitter of transistor 26. A voltage doubler 35 provides signals to one side of a threshold type, differential amplifier 36, if the oscillator provides oscillations due to absence of a metallic object in proximity of an inductor 11. Amplifier 36 includes transistor 36a to the base of which is applied the output of voltage doubler 35. A second transistor 36b obtains a fixed bias. Transistor 36a is conductive and remains conductive through each full oscillation cycle, while transistor 36b is cut off. The base emitter circuit of transistor 36b is such that conduction does not shift to transistor 36b when transistor 36a is rendered temporarily nonconductive due to the oscillatory input at its base. A transistor output amplifier 38 is nonconductive as long as transistor 36b is cut off, so that no current can flow through any load connected to the two output terminals 37. One of the output terminals 37 is the collector of transistor 38, the other one is the B+ terminal.

If an object is too close to the inductor of LC circuit 10, oscillations decay and transistor 36a is rendered nonconductive; conduction shifts to transistor 36b, causing, in turn, transistor 38 to become conductive, so that current can flow through a load across the terminals 37.

FIGURES 4 to 7 illustrate another embodiment which can be used with advantage to practice the present invention in four different configurations. The embodiments in FIGURES 4, 5, 6 and 7 have certain common features, in that the central, active element is an operational amplifier 40 having inverting (−) and noninverting (+) input terminals, further having feedback circuits and direct signal circuits for either of them with a common source (ground) for the direct input signals. One of these circuits includes the LC circuit, the others are resistances. The principle behind these four types of this embodiment is as follows.

First, for sustaining oscillations current and voltage across the LC circuit must be in phase which occurs at resonance. Second, the composite signal provided to the noninverting input (+) of the operational amplifier must be larger than the composite signal provided to the inverting input (−) thereof. The circuits are designed in such a manner that in case the LC circuit does not have substantial losses into a metallic object in the proximity, the conditions for sustaining oscillations are fulfilled, while losses above a critical value impede sustenance of oscillations.

Figure 4:
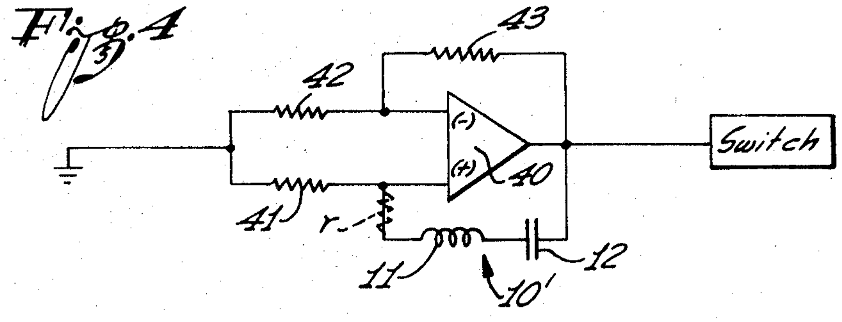
FIGURES 4, 5, 6 and 7 illustrate four different versions of another embodiment of the present invention.

In FIGURE 4 the operational amplifier 40 has direct signal input resistances 41 and 42, respectively connected between ground and the noninverting (+) and the inverting (−) input terminals. A resistor 43 provides feedback from the output of amplifier 40 to the inverting input (−). A series LC circuit 10' provided by coil 11 and capacitor 12 is connected between the output of amplifier 40 and the noninverting input thereof. Reference character $r$ denotes the loss resistance as serially effective in LC circuit 10 between its terminals as connected to amplifier 40.

As was stated above, the series resonance circuit has a small loss resistance $r$ in the absence of metallic objects in the vicinity of the coil 11, while loss resistance $r$ increases as a metallic object approaches. In addition, of course, the complex impedance of the LC circuit is at minimum when the circuit oscillates while the complex impedance for signals other than at resonance frequency, including D-C is higher, which is consonant with the effective loss resistance when oscillations are and are not to be sustained.

The feedback path provides a low impedance feedback for the noninverting input if the LC circuit resonates and exhibits a low loss resistance $r$. The impedance path is purely ohmic at resonance frequency and, therefore, provides in-phase signals at the output terminal of the amplifier 40 and at the noninverting input thereof. If we assume that the direct signals for the two inputs of amplifier 40 are equal, then the feedback signal provided to the noninverting input (+) must exceed the signal to the inverting input (−) of amplifier 40. If the resistance of resistor 43 is $R_3$, then $r<R_3$ is the second condition for oscillation, if the gain of amplifier 40 is high. The general case assumes possible dissimilarity of resistances $R_1$ and $R_2$ respectively of resistor 41 and 42, so that the oscillating condition is $r<R_3R_1/R_2$. This is true only if a lossy object is not in the vicinity of inductor 11. The first condition for sustaining oscillations is thus fulfilled.

If due to losses into an object in the proximity of coil 11 $r>R_3R_1/R_2$, then the inverting input of the operational amplifier 40 receives a signal larger than the noninverting input; operational amplifier 40 will not be able to sustain oscillations; sufficient current to the LC for offsetting the losses is not provided. Not being able to sustain oscillations operational amplifier 40 will provide a D-C output, which is not fed back to the noninverting input except through the very high leakage resistance of capacitor 12. One can see that the critical loss resistance above which oscillations cease to be produced and below which oscillations are being sustained is given by $R_1R_3/R_2$ and can be adjusted by adjusting either one of the resistors 41, 42 and 43.

Figure 5:
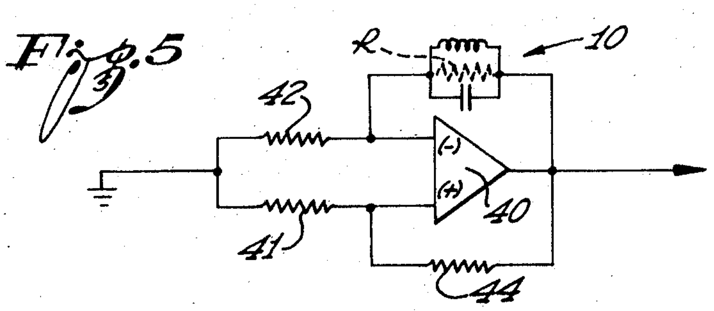

FIGURE 5 illustrates a circuit in which the sensing LC circuit 10 is interconnected in the feedback path for the inverting input of amplifier 40. There is now provided a resistor 44, having resistance $R_4$ and being connected between the output of amplifier 40 and the noninverting input (+) thereof. In conforming with the general condition that the signal at the noninverting input (+) must exceed the signals for the inverting input (−) for oscillatory signals, and that voltage and current are in-phase across the resonance circuit, it follows that oscillations can be sustained if the effective loss resistance in the LC circuit when connected to establish feedback for the inverting input of the operational amplifier has value equal to or larger than $R_4$, if $R_1$ and $R_2$ are equal, of $R>R_4R_1/R_2$.

For this reason, the parallel configuration of the resonance circuit has been chosen. This is consonant with the fact that the complex impedance of the parallel LC circuit 10 is at maximum for the oscillating state. When losses into an object occur, the effective loss resistance R will reduce and the signal to the inverting input will increase. For $R<R_4R_1/R_2$, oscillations cannot be sustained any more. As oscillations cease, the LC circuit decouples from the object and feedback is provided merely through the very small D-C resistance of coil 11; the inverting input signal thus exceeds the noninverting input D-C wise and the nonoscillating state is stably maintained.

Figure 6:
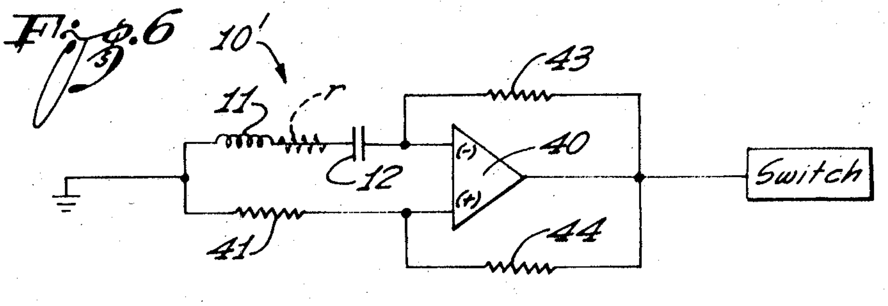
Figure 7:
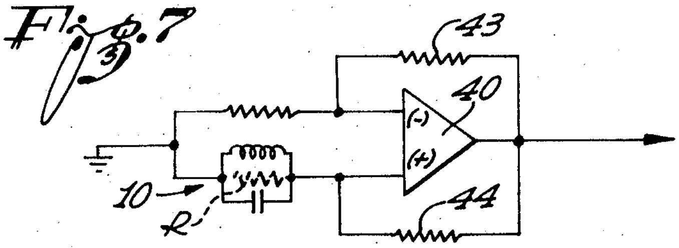

FIGURES 6 and 7 depict the circuit modifications in which the sensing LC circuit 10 or 10' is connected to the direct input signal path, either for the inverting input (FIGURE 6) or for the noninverting input (FIGURE 7) of the operational amplifier. The circuit shown in FIGURE 6 provides the LC resonance circuit in the input circuit for the inverting input. Again, oscillations can be sustained if the input signal for the inverting input terminal is smaller than the input signal for the noninverting input of operational amplifier 40. As this requires an effective small loss resistance $r$ in the inverting input circuit for oscillations a series resonant circuit configuration is required. The condition for sustaining oscillation in this case now is that the effective loss of resistance $r$ must be smaller than $R_1$ if the feedback resistors are equal, or in the general case $r<R_1R_3/R_4$ for oscillation.

Finally, in FIGURE 7, the LC circuit is connected in the direct input signal path for the noninverting input of the operational amplifier 40. Again, the input signal for the noninverting input must exceed the input signal for the inverting input in order to sustain oscillations, so that parallel resonance is chosen. The condition for oscillation $R>R_2R_4/R_3$.

One can see that either of the above circuits has the following properties, which makes them advantageous. The oscillations depend only on the loss resistance of the sensing circuit which is an LC circuit and, depending upon its mode of connection, and its specific function in the feedback circuit for the oscillator amplifier, it is either a parallel or a series resonance circuit. The sensitivity of the device is largely independent of the gain of the amplifier. The actual value of the inductance and the resonance frequency do not enter into consideration. Essential only is the loss resistance in the oscillating state, and the D-C resistance of the LC circuit in the nonoscillating state must be consonant with the maintaining of stable, nonoscillation conditions of the amplifier.

Figure 8:
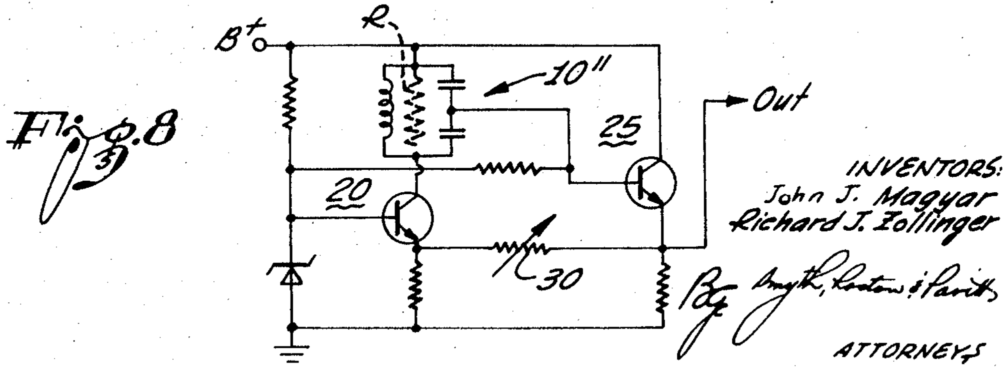
FIGURE 8 illustrates a circuit diagram of a modification of the circuit shown in FIGURE 3.

The embodiment shown in FIGURE 8 is a modification of the circuit shown in FIGURE 3 and follows essentially the same principles. A parallel LC circuit 10'' is provided with current through current amplifier 20 of the unity current gain having a feedback path which includes voltage amplifier 25 for unity voltage gain and the variable resistor 30 as aforedescribed. Since, in this case, there is parallel resonance, oscillations can be sustained if the reflected, parallel loss resistance R is larger than twice the value of the resistance of a resistor 30. The circuit is essentially independent from the resonance frequency and from the effective complex impedance.

The invention is not limited to the embodiments described above but all changes and modifications thereof not constituting departures from the spirit and scope of the invention are intended to be covered by the following claims.

What is claimed is:

1. A proximity switch comprising:

a resonance circuit having an inductance and being capable of oscillating and constructed for positioning to sense proximity of an electrically conducting object in relation to the inductance;

the resonance circuit having a particular loss resistance dependent upon presence, absence and proximity of a conductive object due to inductive coupling between object and inductance;

an amplifier of unity current gain connected to the resonance circuit for feeding current thereto and for controlling the current flow in the resonance circuit; and feedback means connected to the amplifier means and including a particular resistance means for obtaining current flow in the resonance circuit for sustaining oscillation if the loss resistance and the resistance of the resistance means have a particular arithmetic relation and in a particular numerical range, and for preventing sustenance of oscillations if the loss resistance and the resistance of the particular resistance means have the particular arithmetic relation outside of the particular range.

2. A proximity detector for response to absence or presence of a metallic object in the proximity thereof, comprising:

a resonance circuit having an inductance inducing current into a metallic object in the proximity thereof resulting as losses in the resonance circuit, while no such losses occur in the absence of a metallic object in the proximity of the inductance;

the resonance circuit having an effective equivalent loss resistance varying in accordance with the losses into the object when in the proximity of the inductance;

an amplifier connected directly to said resonance circuit for feeding current thereto, further connected through a feedback circuit to the resonance circuit through a separate path to be responsive to the voltage across the resonance circuit for controlling current flow through the amplifier into the resonance circuit for sustaining or inhibiting oscillations in the resonance circuit; and resistance means included in said feedback circuit so that oscillations are sustained in the resonance circuit if the effective loss resistance and the resistance of the resistance means are related in a particular manner, the effective loss resistance when related to the resistance of the resistance means other than in the particular manner inhibiting sustenance of oscillations.

3. A proximity switch comprising:

an operational amplifier having output inverting and noninverting inputs;

a first and a second input circuit respectively connected to the noninverting and inverting inputs of the operational amplifier;

a third and a fourth feedback circuit connected to the output of the operational amplifier and respectively connected to the inverting and noninverting inputs of the operational amplifier;

one of the first, second, third and fourth circuits being an LC circuit, the remaining three circuits being resistances having values so that for resonance of the LC circuit and the then effective loss resistance of the LC circuit the input signal for the noninverting input as provided by the first and fourth circuits exceeds the input signal for the inverting input as provided by the second and third circuits.

4. A switch as set forth in claim 3, one of the first and third circuits being a parallel resonance circuit.

5. A switch as set forth in claim 3, one of the second and fourth circuits being a series resonance circuit.

6. A proximity detector for response to absence or presence of a metallic object in its proximity, and including a voltage source, comprising:

a resonance circuit having an inductance inductively coupled to the metallic object if in the proximity of the inductance;

the resonance circuit having an effective equivalent loss resistance varying in accordance with power losses incurred by the resonance circuit into the object when in the proximity of the inductance;

amplifier circuit means connected in series with the entire resonance circuit, resonance circuit and amplifier circuit connected as series circuit between the terminals of the voltage source, a feedback circuit for the amplifier circuit means connected to be responsive to the voltage across the resonance circuit, for controlling the current flow through the amplifier circuit means and into the entire resonance circuit for sustaining oscillations in the resonance circuit and including a resistance means operative in relation to the effective loss resistance of the resonance circuit for inhibiting oscillations if the losses into an object in the proximity of the inductance exceed a particular value; and circuit means connected to the amplifier circuit means for being responsive to absence or presence of sustained oscillations in the resonance circuit and respectively providing signals representative thereof.

7. A proximity switch comprising:

a resonance circuit having an inductance and being capable of oscillating and constructed for positioning to sense proximity of an electrically conducting object in relation to the inductance;

the resonance circuit having a particular loss resistance dependent upon presence, absence and proximity of a conductive object due to inductive coupling between object and inductance;

an amplifier of fixed current gain connected to the resonance circuit for feeding current thereto and for controlling current flow in the resonance circuit;

feedback means connected to the amplifier and including a particular resistance means for obtaining current flow in the resonance circuit for sustaining oscillation if the loss resistance and the resistance of the resistance means have a particular arithmetic relation and in a particular numerical range, and for preventing sustenance of oscillations if the loss resistance and the resistance of the particular resistance means have the particular arithmetic relation outside of the particular range; and the feedback means being connected to the resonance circuit and including an amplifier providing voltage amplification at a fixed gain, the resistance means connecting the amplifier of fixed voltage amplification gain to the amplifier of fixed current gain, the feedback means controlling sustenance of oscillations in dependence upon the ratio of effective loss resistance of the resonance circuit and of the resistance of the fixed resistance means.

8. A proximity switch comprising:

a resonance circuit having an inductance and being capable of oscillating and constructed for positioning to sense proximity of an electrically conducting object in relation to the inductance;

the resonance circuit having a particular loss resistance dependent upon presence, absence and proximity of a conductive object due to inductive coupling between object and inductance;

an amplifier connected to the resonance circuit for feeding current thereto and for controlling the current flow into the resonance circuit;

feedback means connected to the amplifier and to the resonance circuit for A-C controlling the amplifier so as to sustain oscillations in the resonance circuit;

a resistance included in the feedback means for D-C controlling the bias of the amplifier in dependence upon the loss resistance of the resonance circuit in relation to resistance included in the feedback means; and means connected for additionally controlling the current flow in the amplifier to establish a particular gain therein, operating independently from the bias as provided by the feedback means.

References Cited

UNITED STATES PATENTS

| | | | |
|---|---|---|---|
| 2,819,447 | 1/1958 | Harmon | 331—65 X |
| 2,883,538 | 4/1959 | Elam | 331—65 |

ROY LAKE, Primary Examiner

SIEGFRIED H. GRIMM, Assistant Examiner

U.S. Cl. X.R.

307—116; 324—41; 331—75, 117, 181; 340—258